(12) United States Patent
Zamat

(10) Patent No.: US 6,314,278 B1
(45) Date of Patent: Nov. 6, 2001

(54) ADJUSTING GAIN IN A RECEIVER USING RECEIVED SIGNAL SAMPLE VALUES

(75) Inventor: Hassan Zamat, San Diego, CA (US)

(73) Assignee: Uniden America Corporation, Ft. Worth ( * ) Notice: Subject to any disclaimer, the term of this patent is extended or adjusted under 35 U.S.C. 154(b) by 0 days.

(21) Appl. No.: 09/222,647

(22) Filed: Dec. 30, 1998

(51) Int. Cl.⁷ ....................................... H04B 1/16
(52) U.S. Cl. ................... 455/239.1; 455/234.2; 375/345
(58) Field of Search ............. 455/232.1–250.1, 455/226.1, 226.2, 255, 256, 257, 263, 265, 266; 375/345; 341/132, 155, 156

(56) References Cited

U.S. PATENT DOCUMENTS 5,825,319 * 10/1998 Murden et al. ................ 341/132
5,917,865 * 6/1999 Kopmeiners et al. ............ 375/345

* cited by examiner

Primary Examiner—Lee Nguyen
(74) Attorney, Agent, or Firm—Heller Ehrman White & McAuliffe

(57) ABSTRACT

A mobile communication device comprising a handset achieves gain control of a received signal by adjusting gain of the received signal based on A/D converter samples of the received signal, rather than on power $I^2$ and $Q^2$ calculations of the received signal. The device processes a received signal and adjusts its gain by first setting signal gain to a maximum level, then providing the amplified received signal to an analog-to-digital converter (ADC) that produces a predetermined number of ADC signal sample values in a single cycle of an estimated signal frequency of the received signal. Setting the signal gain to a maximum initial level will cause a number of ADC signal sample values to have full scale magnitude, indicating saturation of the ADC. Next, the device continues processing by determining the number of ADC signal sample values that indicate full scale magnitude of the received signal within a signal cycle, and then adjusts the signal gain from the maximum level that causes the number of ADC signal sample values that indicate full scale magnitude to be above a predetermined saturation threshold so as to reduce the signal gain until the saturation threshold is not exceeded. In this way, a communications device constructed in accordance with the invention provides improved signal gain control and associated processing performance with minimized costs.

28 Claims, 6 Drawing Sheets

| CONDITION | ADJUST |
|---|---|
| IF > 12 SAMPLES = 1111 OR = 0000 | -20 dB |
| > 8 SAMPLES = 1111 OR 0000 | -10 dB |
| > 4 SAMPLES = 1111 OR 0000 | -5 dB |
| > 2 SAMPLES = 1111 OR 0000 | -2 dB |
| 1 SAMPLE = 1111 OR 0000 | -1 dB |

US 6,314,278 B1

ADJUSTING GAIN IN A RECEIVER USING RECEIVED SIGNAL SAMPLE VALUES

BACKGROUND OF THE INVENTION

1. Field of the Invention

This invention relates generally to communication devices and, more particularly, to processing of received signals in mobile communication devices.

2. Description of the Related Art

Mobile communication devices can include a wide range of devices, including cellular telephones, personal communication devices, and cordless telephones. Such devices include a handset that receives transmitted communication signals from a base station or cell station. The transmitted signal comprises a baseband voice signal that was modulated onto a carrier frequency to produce a signal that can be transmitted over an assigned band of the radio frequency spectrum. At the receiving handset, the modulated signal is received. The handset must then remove the carrier frequency to retrieve the baseband voice signal. A similar sequence of processing occurs in sending a voice signal from the handset to the base station.

More recently, the processing of the received signal occurs in the digital domain, although the transmitted signal is received as an analog signal. Thus, the received signal must undergo an analog-to-digital (A/D) conversion process. As the mobile communication device is moved about, the received signal strength can vary. For proper digital conversion, it is necessary to maintain control over the signal magnitude. Therefore, processing of the received signal usually includes amplification of the received signal, determination of received signal strength, and received signal gain control. In addition, the demodulation of the received signal for removal of the carrier frequency requires internal generation of a signal at the carrier frequency. This typically is achieved using a master clock signal that is generated in the handset. Inaccuracy in the master clock signal or parts imperfection can cause a DC offset in the generated signal and also result in an offset in the demodulated signal, which can prevent proper demodulation of the received signal.

Gain control of the received signal is typically achieved with a calculation of signal power by a standard computation involving I and Q terms of the A/D conversion process. In particular, the signal power is determined to be equal to the sum of the $I^2$ and $Q^2$ terms, where I and Q are A/D conversion terms of the received signal. Under conditions of fading and spectrum noise that are typical for a mobile communications device, such a signal power calculation can be difficult and unreliable. The response time to variations in the received signal strength can be unsatisfactory, and oscillation of gain adjustment can occur, causing further problems in signal demodulation. Response time can be faster and production costs can be lower if the processing is kept as simple as possible.

It should be apparent that signal gain control and associated processing performance can be improved and costs minimized with careful processing schemes for the received signal in a mobile communications device. It also would be advantageous if such improved performance would extend to better determination of received signal strength and superior generation of the master clock signal for better demodulation of the received signal and removal of the carrier frequency from the received signal.

From the discussion above, it should be apparent that there is a need for a mobile communications device with improved processing of the received signal without complex processing requirements. The present invention fulfills this need.

SUMMARY OF THE INVENTION

The present invention provides superior gain control of a received signal, without complicated additional signal processing, by utilizing A/D circuitry to determine gain control adjustment of the received signal based on the A/D samples of the received signal, rather than on power $I^2$ and $Q^2$ calculations of the received signal or 2 signals I and Q. This technique can be used with a single input. Using the A/D samples for gain control better maintains the signal gain so as to ensure proper A/D processing, efficiently utilizes A/D circuitry that is already provided for digital signal processing, and can be accomplished with relatively simple signal processing decisions. The gain is controlled so as to ensure that the received signal does not cause excessive full scale magnitude signal levels in the A/D converter (ADC), a situation referred to as saturation of the ADC. The gain control based on ADC signal samples can be implemented in simple hardware circuitry or in signal processing software. In this way, a communications device constructed in accordance with the invention provides improved signal gain control and associated processing performance with minimized costs.

In one aspect of the invention, a communications device processes a received signal and adjusts gain by amplifying the received signal after first setting signal gain to a maximum level, then providing the amplified received signal to an analog-to-digital converter (ADC) that produces a predetermined number of ADC signal sample values in a single cycle of the received signal. Setting the signal gain to a maximum initial level will ensure that low power signals will not go undetected, and initially cause a number of ADC signal sample values to have full scale magnitude, indicating saturation of the ADC. Next, the device continues processing by determining the number of ADC signal sample values that indicate full scale magnitude of the received signal within a signal cycle. The device then adjusts the signal gain from the maximum level that causes the number of ADC signal sample values indicating full scale magnitude to be above a predetermined saturation threshold, so as to reduce the signal gain until the saturation threshold of full scale values is not exceeded during a signal cycle.

Other features and advantages of the present invention should be apparent from the following description of the preferred embodiment, which illustrates, by way of example, the principles of the invention.

DESCRIPTION OF THE PREFERRED EMBODIMENTS

Figure 1:
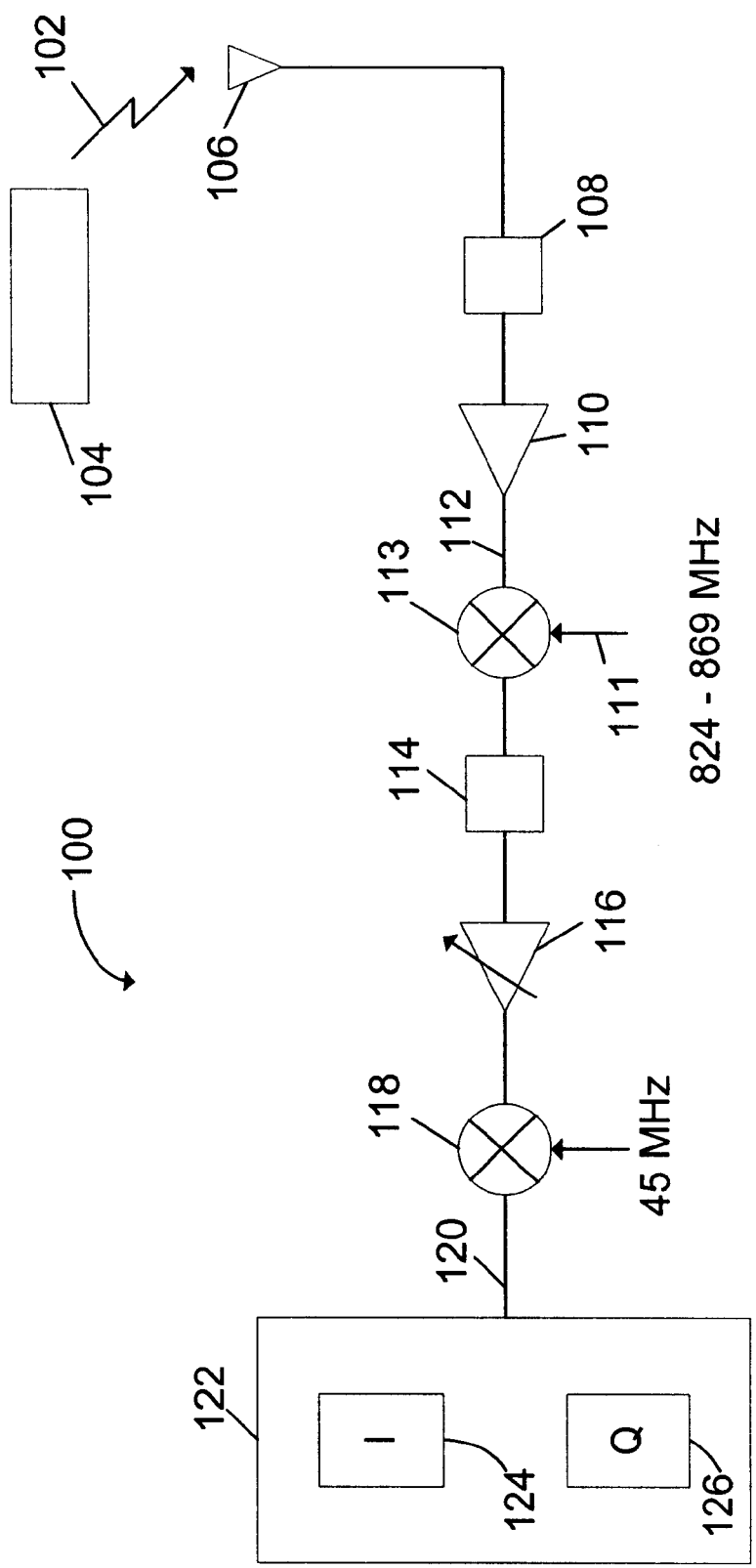
FIG. 1 is a schematic diagram that illustrates the sequence of signal processing carried out by a mobile communications device constructed in accordance with the present invention.

FIG. 1 illustrates an exemplary mobile communications device 100 constructed in accordance with the present invention. The device comprises a telephone handset that receives a radio frequency (RF) signal 102 from a transmitter 104 at an antenna 106. For typical applications in North America, the received signal is within a frequency range of 869 megahertz (MHz) to 894 MHz. This frequency range corresponds to the spectrum assigned to mobile communications. The received signal is then subjected to certain standard signal conditioning processes, including a filter 108 and an amplifier 110.

Prior to transmission in the 869 to 894 MHz band, the RF signal 102 comprised an original voice signal that was modulated onto a 45 MHz carrier frequency, and in a next step of processing an 824–849 MHz signal 111 is subtracted from the 869–894 MHz received signal 112 in a mixer 113 to produce a down converted 45MHz signal, represented by the 45 MHz block 114. After the 45 MHz signal is produced, it is subjected to gain processing in a variable gain amplifier 116, after which the 45 MHz carrier signal is removed in a subtracting signal mixer 118, leaving the desired original baseband signal 120 containing the original voice transmission. The signal content of the baseband signal typically extends from 0 Hz to 3 kHz. After the gain amplifier 116, the baseband signal 120 is then subjected to an analog-to-digital (A/D) conversion process in an A/D converter (ADC) 122, which produces digital sample values comprising I and Q terms 124, 126.

A/D Conversion

In accordance with the invention, gain control adjustment of the received signal at the variable gain amplifier 116 is based on the A/D conversion samples of the received signal, rather than on power $I^2$ and $Q^2$ calculations of the received signal. Using the A/D conversion samples for gain control better maintains the signal gain so as to ensure proper A/D processing by the ADC 120, efficiently utilizes A/D circuitry that is already provided for digital signal processing, and can be accomplished with relatively simple signal processing decisions. The communications device 100 controls the signal gain during normal operation so as to ensure that the received signal does not cause excessive full scale magnitude signal levels in the ADC, a situation referred to as saturation of the ADC. The gain control based on ADC conversion samples can be implemented in simple hardware circuitry or in signal processing software. In this way, a communications device constructed in accordance with the invention provides improved signal gain control and associated processing performance, with minimal costs.

Figure 2:
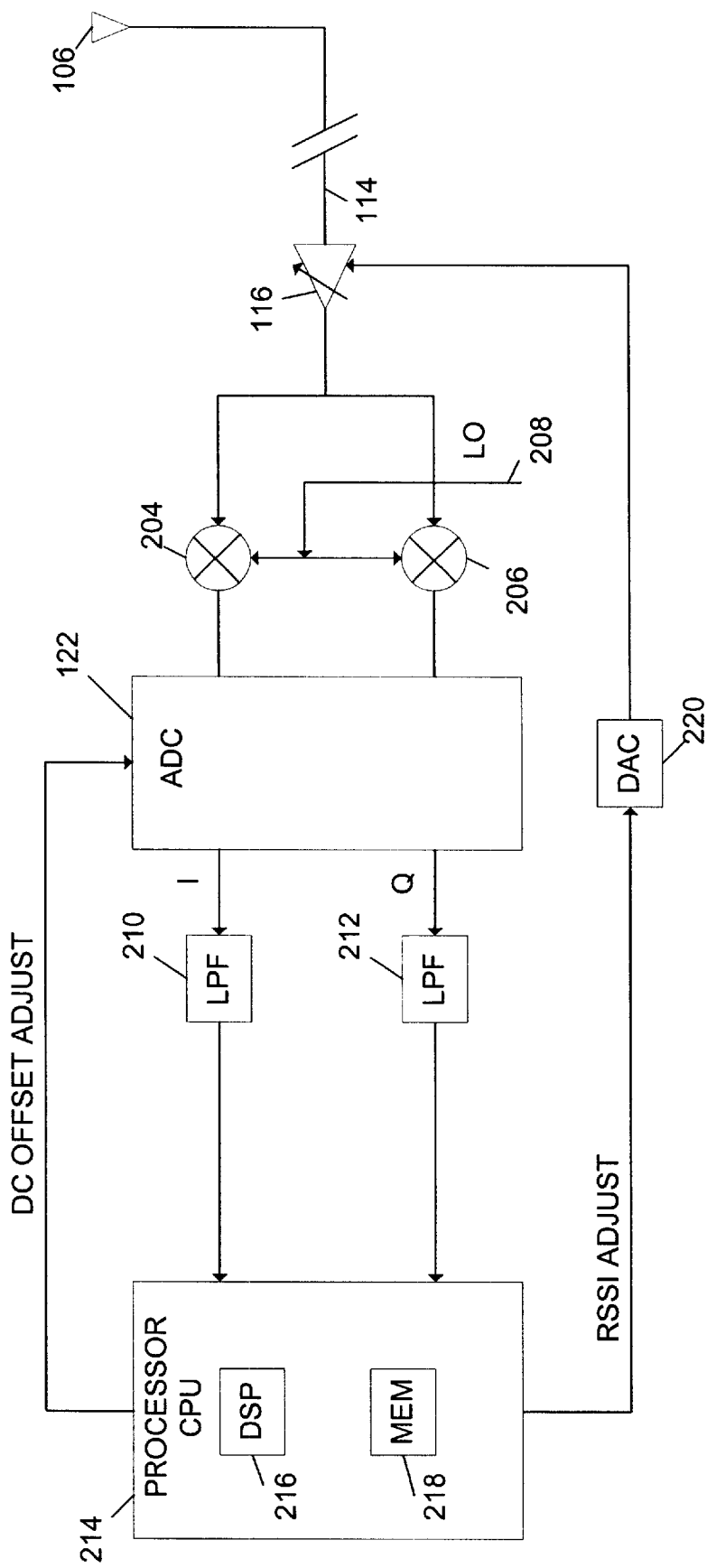
FIG. 2 is a block diagram of the signal processing components in the mobile communications device illustrated in FIG. 1.

FIG. 2 is a block diagram that shows details of the variable gain signal processing circuitry components in the mobile communications device 100 illustrated in FIG. 1. As noted above, down converted signal 114 is provided to a variable gain amplifier 116. The 45 MHz signal is received and combined with duplicate signals in two mixers 204, 206 in response to a "LO" signal 208. The outputs of the two mixers are provided to the ADC 122 to produce the I and Q outputs. The I and Q outputs are provided to two low-pass filters 210, 212 for signal conditioning, and then are provided to a central processing unit (CPU) 214 of the communications device. The CPU controls operation of the communications device and may include a special purpose digital signal processor (DSP) 216 that receives the I and Q outputs for computation. The CPU 214 includes memory 218 in which data and program instructions are stored. After a gain adjustment decision has been made by the CPU, a signal level calculation control signal is provided to a digital-to-analog converter (DAC) 220 that produces a control signal to the variable gain amplifier 116. In this way, the CPU 214 controls the output gain level of the variable gain amplifier to ensure proper operation of the ADC 122.

Gain Adjustment

To perform gain adjustment, the communication device 100 performs signal processing that includes first amplifying the received signal by setting the signal gain to a maximum level and then providing the amplified received signal to the ADC 122, which produces a predetermined number of signal sample values in a single cycle of an estimated signal frequency of the received downconverted signal. The communications device continues the gain adjustment processing by determining the number of ADC signal sample values that indicate a full scale magnitude of the received signal within a signal cycle of a signal at a given estimated frequency of interest. Next, the signal gain is adjusted down from the maximum level so as to reduce the signal gain until the saturation threshold is not exceeded. In the preferred embodiment, this is performed in a step-wise fashion in a processing loop.

The gain adjustment process is always performed upon initial application of electrical power to the circuitry of the communications device 100, as part of a start-up sequence of processing steps performed whenever the device is turned on. It is typically necessary to perform gain adjustment repeatedly during normal operation, and therefore the gain adjustment sequence is performed at start-up and also again periodically during normal operation, at a desired frequency of gain adjustment repetition. Gain adjustment will typically not be performed with every cycle of the received signal. This avoids excessive processing overhead for unnecessary gain adjustment processing.

Figures 3, 4:
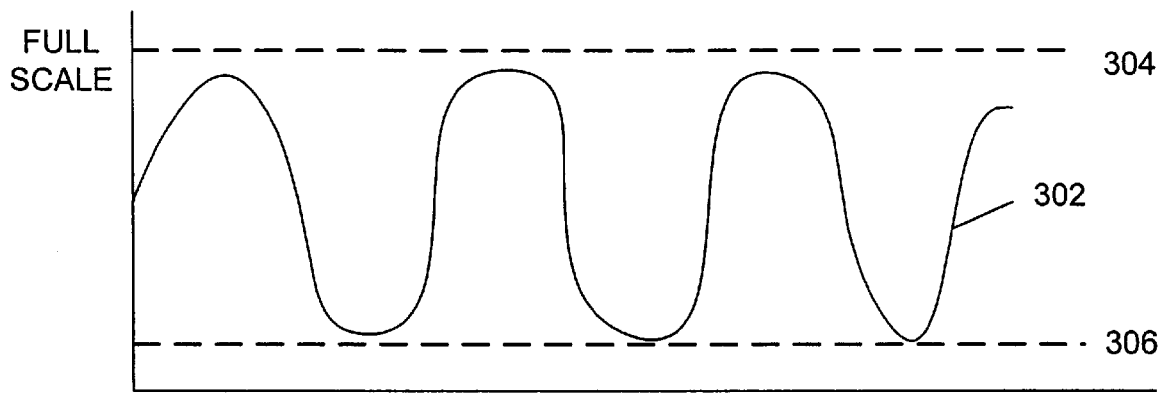
FIG. 3 is a representation of the ADC output for a signal received in the mobile communications device of FIG. 1.
FIG. 4 is a table showing an example of the gain adjustment decisions for the output of the ADC for the mobile communications device of FIG. 1.

When the received signal is first amplified with maximum gain, the received signal magnitude is boosted such that the signal magnitude reaches or exceeds what is referred to as full scale magnitude for the ADC 120. FIG. 3 is an illustration of the received signal magnitude with time across the horizontal axis. FIG. 3 shows that a nominal (ideal) received signal 302 has a magnitude between an upper ADC saturation threshold 304 and a lower ADC saturation threshold 306. In the illustrated telephone communications device 100, received signals that are provided to the ADC for further processing comprise RF communication signals of 45 MHz plus the baseband (voice) signal. This signal will be referred to generically as "the 45 MHz received signal", although it will be understood that the signal, after initial processing, actually comprises a 45 MHz carrier signal plus baseband signal. Because the frequency range of the voice signal is 0 Hz to 3 kHz, the estimated frequency of the 45 MHz received signal is regarded as 45.3 MHz.

In the ADC 120, a sampling interval is selected to provide generally thirty-two samples per cycle of the 45 MHz received signal (as noted above, actually 45.3 MHz). The sample times are indicated by hash marks along the horizontal axis (not all thirty-two hash marks are shown along the horizontal axis, for purposes of simpler illustration). The magnitude of each signal sample is digitally represented by a fixed number of data bits. In the preferred embodiment, for example, eight bits are used for each sample. Whenever the magnitude of the 45 MHz received signal exceeds the saturation threshold 304 or 306 of the ADC 120, all relevant bits of the digital representation are set to ones (for example, a binary value of 1111 1111 for the eight bits) if greater than the threshold 304, or to zeroes if less than the lower threshold 306. It should be apparent that no magnitude information is conveyed about a signal once that signal exceeds the saturation threshold of the ADC.

In accordance with the invention, a saturation condition is declared when a specified number of sample bits during a single cycle of the 45 MHz received signal exceed either end of the saturation threshold 304 or 306. In the preferred embodiment, a step-wise approach to gain adjustment is used, based on the number of ADC signal samples that exceed the threshold in a single cycle of the 45 MHz received signal. This is illustrated in FIG. 4.

FIG. 4 shows that, if more than twelve samples out of thirty-two in a cycle exceed the saturation threshold, being either all ones or all zeroes, then the CPU of the device will reduce the gain of the variable gain amplifier (FIG. 2) by an amount sufficient to reduce the gain by 20 dB (a reduction in signal magnitude in "dB" units is a relative signal reduction that will be recognized and understood by those skilled in the art). If more than eight and up to twelve samples in a signal cycle exceed the threshold, then the variable gain amplifier is reduced by an amount sufficient to reduce the gain by 10 dB. In a similar way, samples of four, two, and one that exceed the saturation threshold during a signal cycle result in respective reductions of 5 dB, 2 dB, and 1 dB. In this way, large reductions of signal gain are possible without risk of oscillation that might result from too rapid a reduction. For example, it might be necessary to adjust the gain by an overall amount of –60 dB, which could be achieved in three sequential reductions of 20 dB. Other combinations of reductions may occur. Typical signals received by the communication device have a signal magnitude that is down from full scale by –20 dB for a strong signal, to –60 dB for a weak signal.

It is important to recognize that a received signal should not consistently produce full scale magnitude (saturation) levels in the ADC. Therefore, the variable gain amplifier output is reduced if the saturation threshold is exceeded. It is also important, however, to protect against reducing amplifier gain prematurely and by too large an amount, because otherwise a low power received signal might not be detected. Therefore, the preferred embodiment begins gain adjustment processing by initially setting the variable amplifier gain to a maximum level. The gain is then iteratively reduced, as described above, until the saturation threshold is not consistently exceeded. This ensures that robust signal levels will be produced as input to the ADC. When gain adjustment processing is next started, the process is repeated and gain is set to a maximum level.

Because processing overhead would be excessive if gain adjustment were continuously performed with maximum gain and subsequent iterative reduction, such processing is not performed with every cycle of the 45 MHz received signal. Nevertheless, the iterative gain adjustment processing of the preferred embodiment is not a great added processing burden on the device CPU, because many of the computational steps that take up processor resources for the gain adjustment are performed anyway, for the analog-to-digital conversion process.

Logic Implementation

Figure 5:
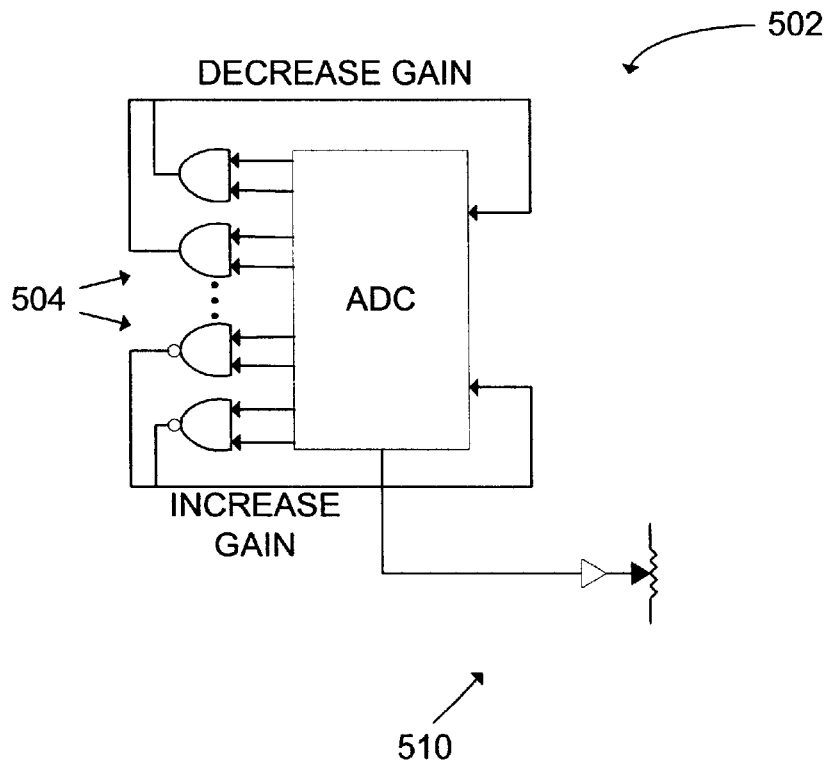
FIG. 5 is a block diagram showing an exemplary hardware circuit to perform the gain adjustment processing of the FIG. 1 mobile communications device.

If desired, the gain adjustment processing described above can be implemented in hardwired circuitry using logic gates. Those skilled in the art will understand that a signal that exceeds the upper saturation threshold 304 will produce ADC output wherein the most significant bits (MSB) will be all ones, and a signal that exceeds the lower saturation threshold 306 will produce ADC output wherein the least significant bits (LSB) will be all zeroes. Thus, FIG. 5 illustrates portions of a logic circuit 502 that processes the ADC output with logic gates 504 to either decrease gain (MSB all ones) or increase gain (LSB all zeroes). The logic gates can comprise AND gates and NAND gates, as well understood by those skilled in the art. A voltage divider circuit 510 can then be used to produce a control signal to the variable gain amplifier. Those skilled in the art will understand how to implement such a circuit without further explanation.

Received Signal Strength Indication

Determining received signal strength is another task that must be performed by a mobile communications device, The received signal strength indication (RSSI) is used by a variety of signal processing operations. The present invention advantageously permits RSSI to be performed using the gain adjustment information derived from the ADC signal samples of the 45 MHz received signal. During the production process for a mobile communication device, signals of known strength are transmitted to a device and ADC gain adjustments are set for the received signal processing circuitry, to calibrate the ADC output. Thereafter, RSSI can be derived from the ADC output in an extremely accurate manner using gain adjustment processing techniques of the present invention.

More particularly, for a signal of known input strength, the amount of gain reduction needed to avoid saturation of the ADC is known, because of the gain adjustment processing described above. Therefore, in accordance with the present invention, such processing is performed during production and the values are stored in a table of the CPU memory. For example, given an input signal of –40 dB from full scale magnitude, the corresponding ADC output will be known. Similarly, for an input signal of –50 dB, the ADC output will be known, likewise for –60 dB, –70 dB, –80 dB, and so forth. Therefore, after ADC calibration, the RSSI of a received signal can be easily derived by consulting the table and interpolating between ADC output values in the calibration table.

DC Offset

In another aspect of the invention, DC offsets in the baseband signal that are attributable to the device master clock and part imperfections can be corrected. Those skilled in the art will understand that all signal processing decisions in the device of the preferred embodiment are based on the ADC output of the 45 MHz received signal, and will understand that, for proper processing, it is critical to ensure that the received signal is centered about its mean magnitude. Thus, if the I and Q values of the ADC output are not symmetric, meaning they are equidistant from the signal mean, then signal processing will suffer. Accordingly, the preferred embodiment checks for a received signal that appears to be displaced from a symmetric distribution, a condition referred to as a DC offset of the signal. Ideally, for maximum benefit, a DC offset correction should be performed prior to gain adjustment processing. This is because a DC offset condition typically does not vary during operation, whereas signal gain can vary due to fading and noise conditions. Correction of DC offset impacts automatic frequency control (AFC) processing.

Figure 6:
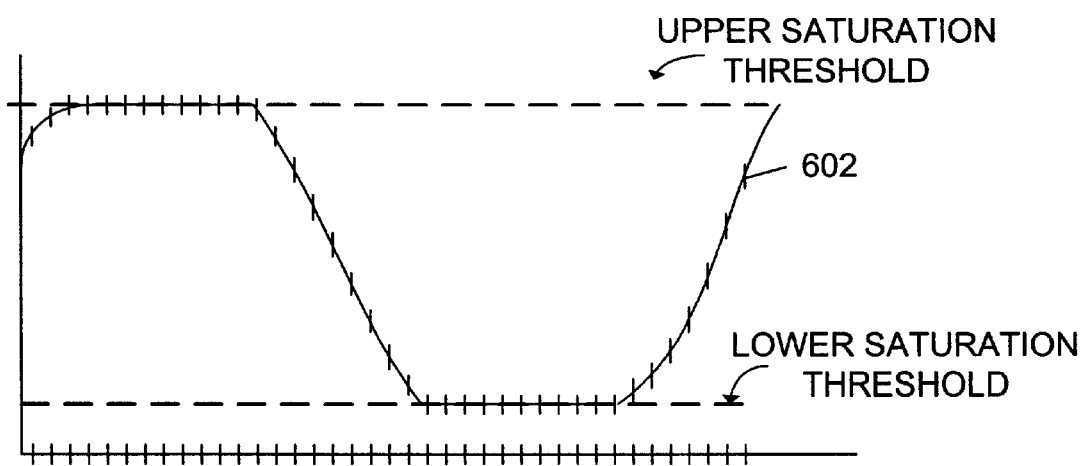
FIG. 6 is a representation of DC offset that can occur if the master clock signal generation does not provide an accurate frequency for demodulation.

Removing the 45 MHz carrier signal from the 45 MHz received signal (leaving the 3 kHz voice signal) requires a 45 MHz signal generated as input to a mixer. A frequency offset in the generation of the 45 MHz signal is equivalent to a DC offset in the 45 MHz received signal. Therefore, if the 45 MHz signal is centered and then a DC offset is detected, it can be concluded that there is a frequency offset in the generated 45 MHz signal. If there is a frequency offset in the generated signal, then a signal oscillator of the device must be adjusted. FIG. 6 illustrates a DC offset condition of the 45 MHz received signal 602. It should be apparent that such a condition exists when a greater number of signal samples exceed the upper saturation threshold as compared to the number of signal samples that exceed the lower saturation threshold (or the reverse situation).

When the 45 MHz received signal is centered, then the I and Q terms of the ADC output should be symmetric. If the $I^2$ and $Q^2$ terms are used to monitor signal strength and center the frequency, however, the terms may indicate that the received signal is centered when it actually is not. Conventionally, DC offset is determined by examining ADC signal power using the $I^2$ and $Q^2$ terms, so there is a chance that there may be a frequency offset in the master clock oscillator output will go undetected. In the preferred embodiment, if a DC offset is detected in the 45 MHz received signal, the CPU responds by invoking a DC offset correction to the master clock oscillator.

Figure 7:
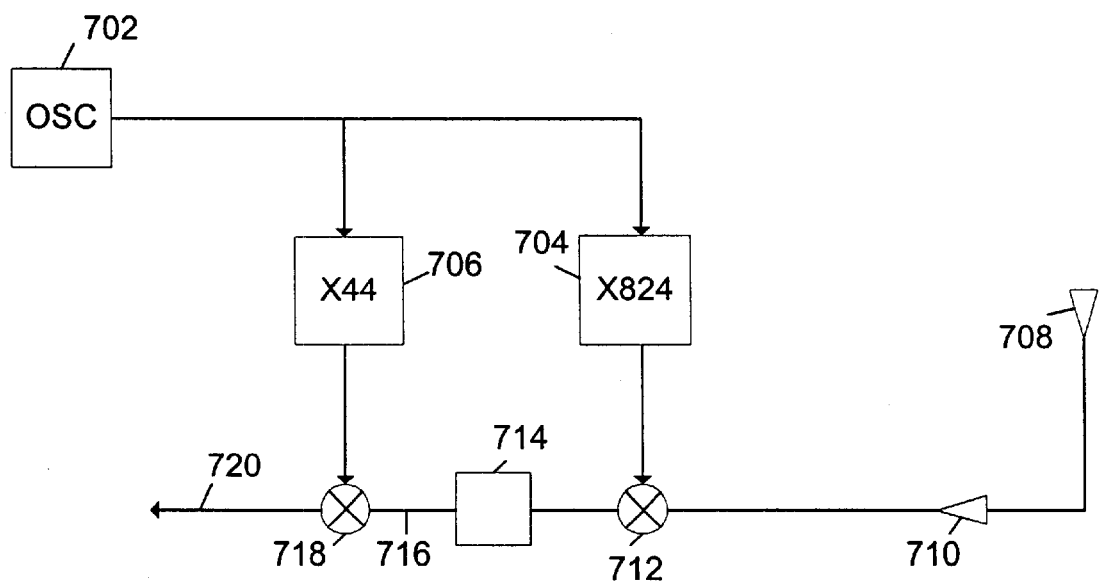
FIG. 7 is a block diagram of signal processing components of the FIG. 1 device to correct any DC offset condition in the master clock output.

The DC offset correction is illustrated in FIG. 7, which is a block diagram of the signal processing in the preferred embodiment communications device incorporating DC offset correction. FIG. 7 shows that, for example, a master clock oscillator 702 generates a nominal 1.0 MHz signal that is provided to processing filters shown as blocks 704, 706 that multiply the 1.0 MHz signal to produce an 824 MHz signal and a 45 MHz signal, respectively. The signal received at the device antenna 708 is amplified 710 and then provided to a mixer 712 that subtracts the 824 MHz carrier signal. Gain adjustment is performed in the variable gain amplifier 714, where signal frequency centering can be checked for. The resulting 45 MHz received signal 716 is provided to another mixer 718 that removes the 45 MHz carrier signal, leaving the baseband signal 720. If there is a DC offset in the baseband signal 720, then the CPU (FIG. 2) adjusts the operation of the oscillator 702 using well-known techniques. It should be apparent that any error in the oscillator operation that results in a 1.0 MHz signal that is actually of a different frequency, will result in a DC offset in the 45 MHz received signal 716 and in the baseband signal 720. The processing described for DC offset correction should minimize any such problems.

Communications Device Processing

Figure 8:
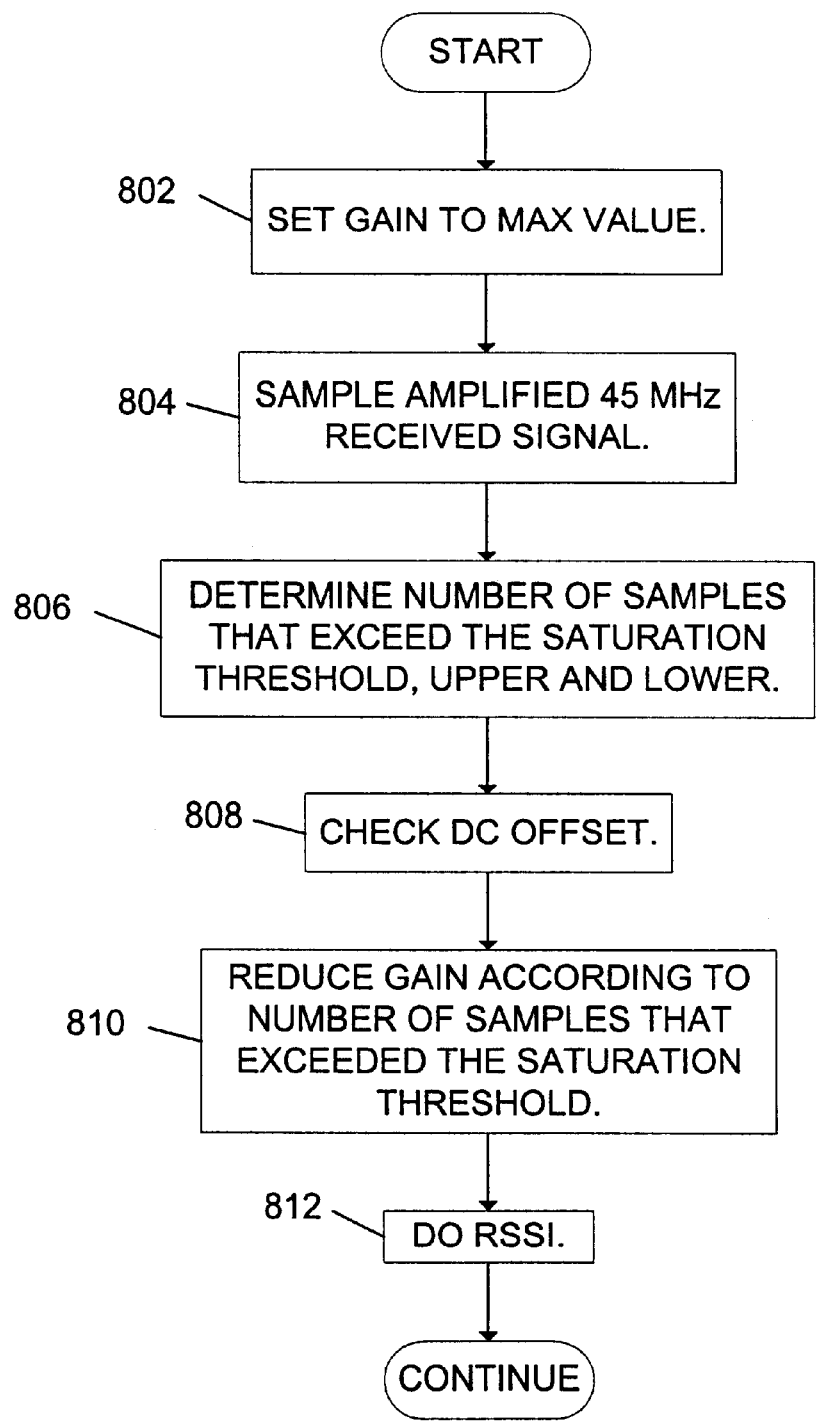
FIG. 8 is a flow diagram that illustrates the processing steps executed by the mobile communications device of FIG. 1.

FIG. 8 is a flow diagram that illustrates the processing steps executed by the mobile communications device of FIG. 1. These processing steps can be executed by software program instructions stored in the memory of the CPU, or can be implemented in hardwired logic circuitry such as described above in FIG. 5. In the first operating step, represented by the flow diagram box numbered 802, the gain of the variable gain amplifier is set to a maximum value to ensure that low power received signals do not go undetected. In the next operating step, the received signal is sampled (or digitized) according to a sampling interval that is well above the Nyquist number for the estimated signal frequency range of interest. This operating step is represented by the flow diagram box numbered 804.

In the next processing step, represented by the flow diagram box numbered 806, the number of received signal samples that exceed a saturation threshold is determined. Next, indicated by the flow diagram box numbered 808, the 45 MHz received signal is checked for DC offset problems. If necessary, the CPU will adjust the operation of the master clock oscillator until no DC offset problems are detected.

Next, the variable gain amplifier is adjusted in response to the number of samples that exceed the saturation threshold. As noted above, the gain can be reduced by an amount that depends on the number of signal samples that exceed the saturation threshold. In addition, a coarse adjustment process can be initiated in response to a predetermined number of signal samples in a coarse adjustment step, to be followed by a fine adjustment step in which a smaller number signal samples are checked for exceeding the saturation threshold. Thus, coarse adjustment processing may be triggered if more than half of the signal samples in a single cycle of the signal exceed the saturation threshold, and thereafter a fine adjustment processing operation may be triggered if a reduced number of signal samples exceed the threshold. During fine adjustment, for example, only eight of thirty-two signal samples may be required to trigger a saturation condition in which fine gain adjustment will be performed, and the amount of signal gain reduction may be in proportion to the number of the eight signal samples that exceed the saturation threshold value. All such gain adjustment processing is represented by the flow diagram box numbered 810.

Finally, the RSSI processing may be performed, as required by the CPU, using the ADC calibration data performed during device manufacture, produced from the signal sample data operations performed in accordance with the sampling and saturation threshold detection described above. Device operations then continue as normal.

The present invention has been described above in terms of a presently preferred embodiment so that an understanding of the present invention can be conveyed. There are, however, many configurations for mobile communication devices not specifically described herein but with which the present invention is applicable. The present invention should therefore not be seen as limited to the particular embodiments described herein, but rather, it should be understood that the present invention has wide applicability with respect to communication devices generally. All modifications, variations, or equivalent arrangements and implementations that are within the scope of the attached claims should therefore be considered within the scope of the invention.

I claim:

1. A method of controlling signal gain in a receiver processing system for a received signal, the method comprising the steps of:

amplifying the received signal by setting the signal gain to a maximum level during a gain adjustment sequence of the processing system;

providing the amplified received signal to an analog-to-digital converter (ADC) that produces a predetermined number of ADC signal sample values in a single cycle of an estimated signal frequency of the received signal;

determining the number of ADC signal sample values that indicate full scale magnitude of the received signal within a signal cycle; and adjusting the signal gain from the maximum level that causes the number of ADC signal sample values that indicate full scale magnitude to be above a predetermined saturation threshold so as to reduce the signal gain until the saturation threshold is not exceeded.

2. A method as defined in claim 1, further comprising the step of periodically repeating the steps of determining and adjusting, during normal operation of the processing system.

3. A method as defined in claim 1, wherein the step of adjusting comprises reducing the signal gain by a predetermined amount that varies depending on the number of ADC signal sample values that indicate full scale magnitude within a single cycle of the estimated signal frequency.

4. A method as defined in claim 1, wherein the predetermined saturation threshold comprises a coarse adjustment number of full scale magnitude ADC signal samples and a fine adjustment number of full scale magnitude ADC signal sample values.

5. A method as defined in claim 1, wherein the predetermined saturation threshold comprises a coarse adjustment in which a coarse adjustment number of ADC signal sample values are checked for full scale magnitude, and a fine adjustment in which a fine adjustment number of ADC signal sample values, greater in number than the coarse adjustment number, are checked for full scale magnitude.

6. A method as defined in claim 1, wherein the step of adjusting comprises repeatedly reducing the signal gain by predetermined amounts until the saturation threshold is not exceeded.

7. A method as defined in claim 1, further including the steps of:

performing a received signal strength indicator (RSSI) computation during a production calibration procedure of the receiver, in which a plurality of received signals having known strength are processed;

determining the signal adjustment needed for each received signal having known strength to prevent exceeding the saturation threshold;

constructing a table of RSSI values of the ADC signal sample values for the plurality of received signals based on the determined signal adjustment for each received signal having known strength.

8. A method as defined in claim 1, further including the steps of:

determining a received DC offset for the received signal by comparing the number of ADC signal sample values that exceed the saturation threshold at a maximum received signal amplitude with the number of ADC signal sample values that exceed the saturation threshold at a minimum received signal amplitude; and adjusting the received signal to add or subtract a compensating DC offset to the amplitude of the received signal such that the number of ADC signal sample values that exceed the saturation threshold at the maximum are equal to the number of ADC signal sample values that exceed the saturation threshold at the minimum.

9. A method as defined in claim 8, wherein the step of adjusting comprises adjusting an oscillator frequency that generates a signal to demodulate the received signal such that the received DC offset is reduced.

10. A method of performing signal processing of a received signal in a communications device receiver, the method comprising:

amplifying the received signal by setting the signal gain to a maximum level during a gain adjustment sequence of the processing system;

providing the amplified received signal to an analog-to-digital converter (ADC) that produces a predetermined number of ADC signal sample values in a single cycle of an estimated signal frequency of the received signal;

determining the number of ADC signal sample values that indicate full scale magnitude of the received signal within a signal cycle; and reducing the signal gain from the maximum level by a predetermined level if the number of ADC signal sample values that indicate full scale magnitude within a single cycle of the estimated signal frequency exceeds a coarse adjustment saturation threshold and then repeating the steps of providing and determining, and reducing the signal gain from the predetermined level to a further reduced predetermined level if the number of signal sample values that indicate full scale magnitude within a single cycle of the estimated signal frequency exceeds a fine adjustment saturation threshold, and then repeating the steps of providing and determining until the saturation threshold is not exceeded.

11. A method as defined in claim 10, wherein the number of ADC signal sample values that are checked for full scale magnitude following a fine adjustment are greater than the number of ADC signal sample values that are checked for full scale magnitude following a coarse adjustment.

12. A method as defined in claim 10, further including the steps of:

performing a received signal strength indicator (RSSI) computation during a production calibration procedure of the receiver, in which a plurality of received signals having known strength are processed;

determining the signal adjustment needed for each received signal having known strength to prevent exceeding the saturation threshold; and constructing a table of RSSI values of the ADC signal sample values for the plurality of received signals based on the determined signal adjustment for each received signal having known strength.

13. A method as defined in claim 10, further including the steps of:

determining a received DC offset for the received signal by comparing the number of ADC signal sample values that exceed the saturation threshold at a maximum received signal amplitude with the number of ADC signal sample values that exceed the saturation threshold at a minimum received signal amplitude; and adjusting the received signal to add or subtract a compensating DC offset to the amplitude of the received signal such that the number of ADC signal sample values that exceed the saturation threshold at the maximum are equal to the number of ADC signal sample values that exceed the saturation threshold at the minimum.

14. A method as defined in claim 13, wherein the step of adjusting comprises adjusting an oscillator frequency that generates a signal to demodulate the received signal such that the received DC offset is reduced.

15. A receiver processing device that controls signal gain of a received signal, the device comprising:

a central processing unit (CPU) that controls signal processing operations of the receiver processing device;

a variable gain amplifier that adjusts the magnitude of the received signal during a gain adjustment sequence of the receiver processing device;

an analog-to-digital converter (ADC) that receives the amplified signal from the variable gain amplifier and produces a predetermined number of ADC signal sample values in a single cycle of an estimated signal frequency of the received signal;

wherein the CPU determines the number of ADC signal sample values that indicate full scale magnitude of the received signal within a signal cycle and adjusts the signal gain from the maximum level that causes the number of ADC signal sample values that indicate full scale magnitude to be above a predetermined saturation threshold so as to reduce the signal gain until the saturation threshold is not exceeded.

16. A receiver processing device as defined in claim 15, wherein the CPU periodically repeats the determining and adjusting operations during normal operation of the receiver processing device.

17. A receiver processing device as defined in claim 15, wherein the CPU reduces the signal gain by a predetermined amount that varies depending on the number of ADC signal sample values that indicate full scale magnitude within a single cycle of the estimated signal frequency.

18. A receiver processing device as defined in claim 15, wherein the predetermined saturation threshold comprises a coarse adjustment number of full scale magnitude ADC signal samples and a fine adjustment number of full scale magnitude ADC signal sample values.

19. A receiver processing device as defined in claim 15, wherein the predetermined saturation threshold comprises a coarse adjustment in which a coarse adjustment number of ADC signal sample values are checked for full scale magnitude, and a fine adjustment in which a fine adjustment number of ADC signal sample values, greater in number than the coarse adjustment number, are checked for full scale magnitude.

20. A receiver processing device as defined in claim 15, wherein the CPU repeatedly reduces the signal gain by predetermined amounts until the saturation threshold is not exceeded.

21. A receiver processing device as defined in claim 15, wherein the CPU further:
    performs a received signal strength indicator (RSSI) computation during a production calibration procedure of the receiver, in which a plurality of received signals having known strength are processed;
    determines the signal adjustment needed for each received signal having known strength to prevent exceeding the saturation threshold;
    constructs a table of RSSI values of the ADC signal sample values for the plurality of received signals based on the determined signal adjustment for each received signal having known strength.

22. A receiver processing device as defined in claim 15, wherein the CPU further:
    determines a received DC offset for the received signal by comparing the number of ADC signal sample values that exceed the saturation threshold at a maximum received signal amplitude with the number of ADC signal sample values that exceed the saturation threshold at a minimum received signal amplitude; and
    adjusts the received signal to add or subtract a compensating DC offset to the amplitude of the received signal such that the number of ADC signal sample values that exceed the saturation threshold at the maximum are equal to the number of ADC signal sample values that exceed the saturation threshold at the minimum.

23. A receiver processing device as defined in claim 22, wherein the CPU adjusts the received signal by adjusting an oscillator frequency that generates a signal to demodulate the received signal such that the received DC offset is reduced.

24. A receiver processing device that performs signal processing of a received signal, the device comprising:
    a central processing unit (CPU) that controls signal processing operations of the receiver processing device;
    a variable gain amplifier that adjusts the magnitude of the received signal during a gain adjustment sequence of the receiver processing device;
    an analog-to-digital converter (ADC) that receives the amplified signal from the variable gain amplifier and produces a predetermined number of ADC signal sample values in a single cycle of an estimated signal frequency of the received signal;
    wherein the CPU amplifies the received signal by setting the signal gain to a maximum level during a gain adjustment sequence of the processing system;
    provides the amplified received signal to an analog-to-digital converter (ADC) that produces a predetermined number of ADC signal sample values in a single cycle of an estimated signal frequency of the received signal;
    determines the number of ADC signal sample values that indicate full scale magnitude of the received signal within a signal cycle; and
    reduces the signal gain from the maximum level by a predetermined level if the number of ADC signal sample values that indicate full scale magnitude within a single cycle of the estimated signal frequency exceeds a coarse adjustment saturation threshold and then repeating the steps of providing and determining, and reducing the signal gain from the predetermined level to a further reduced predetermined level if the number of signal sample values that indicate full scale magnitude within a single cycle of the estimated signal frequency exceeds a fine adjustment saturation threshold, and then repeating the steps of providing and determining until the saturation threshold is not exceeded.

25. A receiver processing device as defined in claim 24, wherein the number of ADC signal sample values that are checked for full scale magnitude following a fine adjustment are greater than the number of ADC signal sample values that are checked for full scale magnitude following a coarse adjustment.

26. A receiver processing device as defined in claim 24, wherein the CPU further:
    performs a received signal strength indicator (RSSI) computation during a production calibration procedure of the receiver, in which a plurality of received signals having known strength are processed;
    determines the signal adjustment needed for each received signal having known strength to prevent exceeding the saturation threshold; and
    constructs a table of RSSI values of the ADC signal sample values for the plurality of received signals based on the determined signal adjustment for each received signal having known strength.

27. A receiver processing device as defined in claim 24, wherein the CPU further:

determines a received DC offset for the received signal by comparing the number of ADC signal sample values that exceed the saturation threshold at a maximum received signal amplitude with the number of ADC signal sample values that exceed the saturation threshold at a minimum received signal amplitude; and adjusts the received signal to add or subtract a compensating DC offset to the amplitude of the received signal such that the number of ADC signal sample values that exceed the saturation threshold at the maximum are equal to the number of ADC signal sample values that exceed the saturation threshold at the minimum.

28. A receiver processing device as defined in claim 27, wherein the CPU adjusts the received signal by adjusting an oscillator frequency that generates a signal to demodulate the received signal such that the received DC offset is reduced.

* * * * *